(12) United States Patent  (10) Patent No.: US 8,163,643 B1
Othieno et al.  (45) Date of Patent: Apr. 24, 2012

(54) ENHANCED PAD DESIGN FOR SOLDER ATTACH DEVICES

(75) Inventors: Maurice O. Othieno, Alameda, CA (US); Ramaswamy Ranganathan, Saratoga, CA (US); Frederick E. Beville, San Jose, CA (US); David A. Pruitt, San Jose, CA (US); William D. Griffitts, Santa Clara, CA (US)

(73) Assignee: Linear Technology Corporation, Milpitas, CA (US)

( * ) Notice: Subject to any disclaimer, the term of this patent is extended or adjusted under 35 U.S.C. 154(b) by 154 days.

(21) Appl. No.: 12/773,477

(22) Filed: May 4, 2010

Related U.S. Application Data

(60) Provisional application No. 61/238,239, filed on Aug. 31, 2009.

(51) Int. Cl.
*H01L 21/44* (2006.01)

(52) U.S. Cl. . 438/612; 438/106; 257/678; 257/E21.499; 257/E21.506; 257/E21.509

(58) Field of Classification Search .................. 438/106, 438/121, 612, 613; 257/678, 687, 676, E21.499, 257/506, 509
See application file for complete search history.

(56) References Cited

U.S. PATENT DOCUMENTS

| | | | |
|---|---|---|---|
| 6,777,803 B2 | 8/2004 | Othieno et al. | |
| 6,825,563 B1 | 11/2004 | Ranganthan et al. | |
| 7,646,091 B2 | 1/2010 | Othieno et al. | |
| 2004/0238939 A1* | 12/2004 | Wu | 257/691 |
| 2004/0251130 A1* | 12/2004 | Liu et al. | 204/298.01 |
| 2005/0173807 A1* | 8/2005 | Zhu et al. | 257/777 |

* cited by examiner

*Primary Examiner* — David Nhu
(74) *Attorney, Agent, or Firm* — McDermott Will & Emery LLP

(57) ABSTRACT

A semiconductor device is disclosed that has a die and a substrate having a die attachment area with a perimeter. A layer of solder connects the substrate and the die, the solder layer having at least one vent channel connected to the perimeter of the die attachment area, wherein the maximum distance from any point in the solder layer to the nearest free surface of the solder at a vent channel or at the perimeter of the die is less than the distance from the center of the die to the nearest edge of the die.

20 Claims, 7 Drawing Sheets

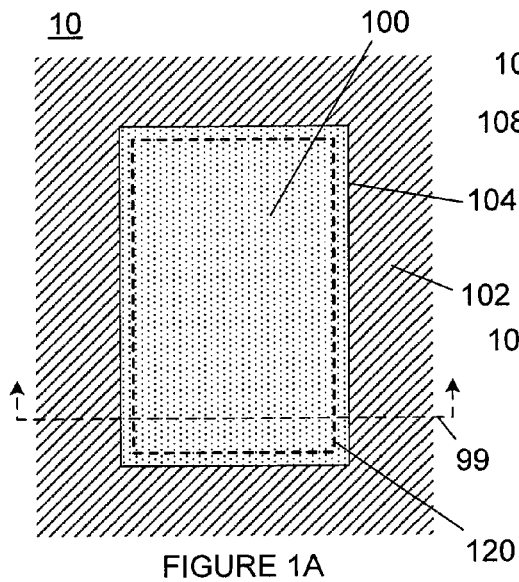
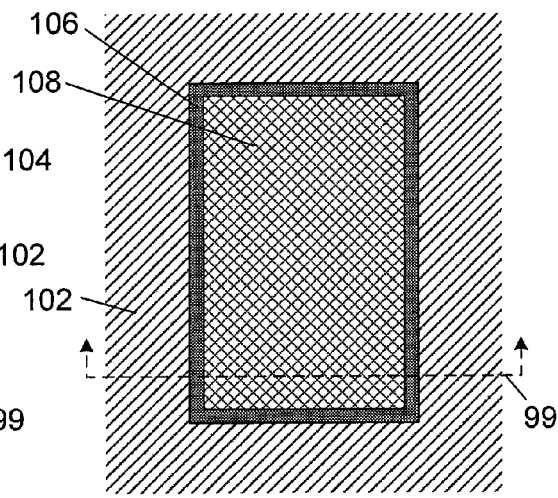
FIGURE 1A
PRIOR ART
FIGURE 2A
PRIOR ART
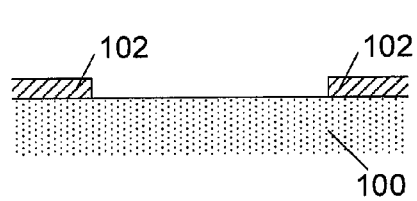
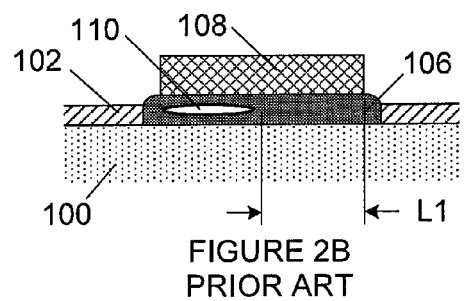
FIGURE 1B
PRIOR ART
FIGURE 2B
PRIOR ART
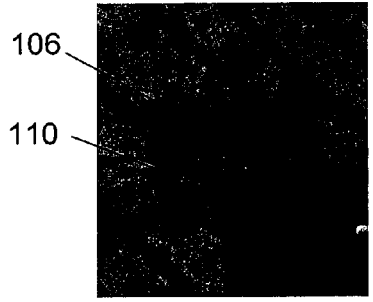
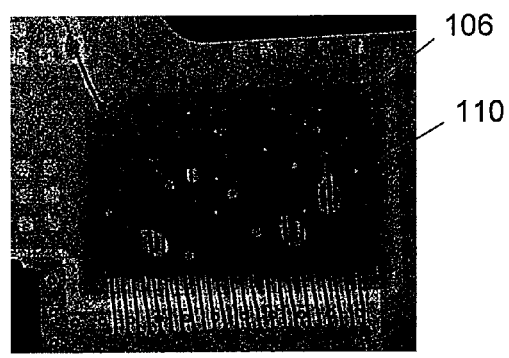
FIGURE 3
PRIOR ART
FIGURE 4
PRIOR ART

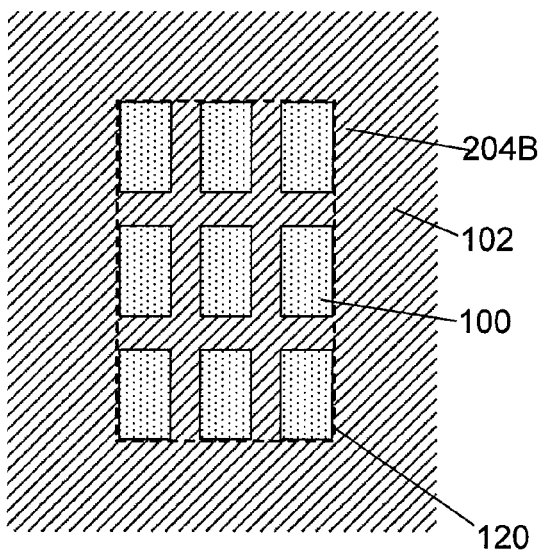
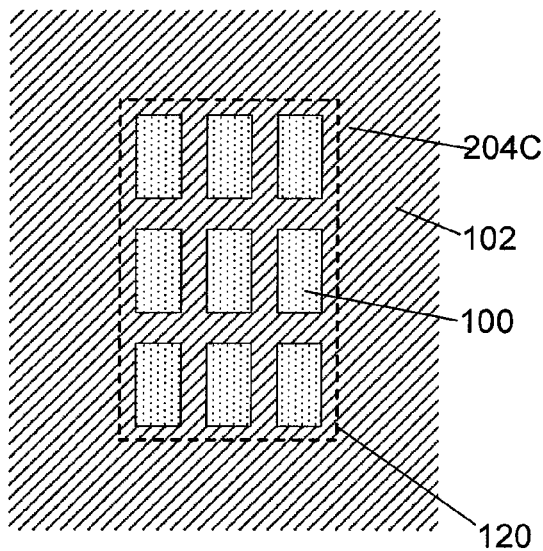
FIGURE 10A
FIGURE 10B
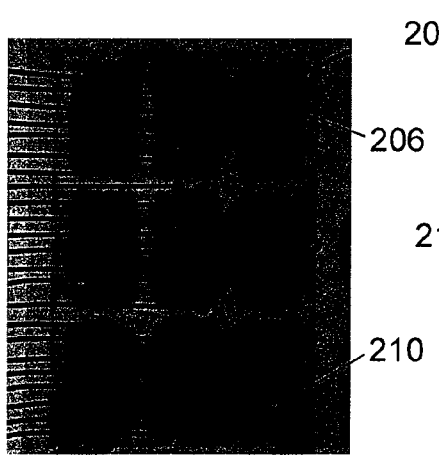
FIGURE 11
FIGURE 12

ENHANCED PAD DESIGN FOR SOLDER ATTACH DEVICES

This application claims the benefit of priority under 35 U.S.C. §119 from U.S. Provisional Patent Application Ser. No. 61/238,239 entitled "ENHANCED PAD DESIGN FOR SOLDER ATTACH DEVICES," filed Aug. 31, 2009, which is incorporated by reference in its entirety for all purposes.

BACKGROUND

1. Field

The present disclosure generally relates to packaging of semiconductor dice and, more particularly, to structures and methodology for reducing voids in solder used in the die attach process.

2. Description of the Related Art

Integrated circuit (IC) chips are enclosed in a variety of packages including dual inline pin (DIP) devices, plastic leaded chip carrier (PLCC) devices, and ball grid array (BGA) devices. Many of these contain multiple internal semiconductor components that are mounted to a substrate, sometime referred to as a "leadframe", in a process called "die attach" or "die bond" and interconnected by a process such as wirebonding. The substrate is often metal and the components are soldered to the substrate to provide mechanical attachment and good thermal contact to dissipate heat generated in the component. The devices may also be overcoated or encapsulated with a plastic molding compound to provide protection during manufacturing and operation. The entire assembly of substrate, components, external connector pins or pads, and molding compound is then enclosed in a shell that may be, in many commercial applications, made of plastic.

Meeting the moisture resistance test (MRT) requirements is a key qualification process for any semiconductor package. A performance requirement set forth by the Joint Electronic Device Engineering Councils (JEDEC) addresses the effect of moisture on nonhermetic packaged solid state devices. Moisture can affect the substrate, molding compound, and die integrity. The most common failure during the MRT is delamination failure that occurs at any one of the package interfaces. In general, delamination in the package starts from the weakest interface and propagates outwards to the package edge or to other interfaces.

The challenge in maintaining integrity of the package is even greater when solder (a metal alloy) is used as the attach material for the various package components. Low-cost lead-free solder materials that are available in the market have melting temperatures that range from 217 degrees C. for Sn/Ag/Cu (SAC) based alloys to 250 degrees C. for Sn/Sb based alloys. Low-cost lead-based solders with melting temperatures of around 300 degrees C. and above are also available but rarely used in module packaging assembly due to the temperature limitations of passive components.

When solder is used to attach a semiconductor die, large voids can form within the solder during reflow due to failure of air to escape as the solder flows. Voids can also be created by the generation of gas from the flux or moisture present in the area. Large voids within the bulk of the solder may reduce the mechanical strength of the bond between the die and the substrate and can be points of crack initiation when the solder is under stress. The trapped gases within the voids in the solder can act as high vapor pressure points that worsen package moisture sensitivity level. Semiconductor packages must also be able to withstand surface mount temperatures in excess of 250 degrees C. during printed circuit board (PCB) assembly. Failure to meet the temperature requirements may tend to lead to component failure during board mount or, worse, field failures.

There are several reasons why molten solder can flow and then undesirably spread out within an encapsulated package. These reasons include mismatch between the coefficients of thermal expansion of the die and substrate materials, vapor pressure, temperature and moisture. When the critical stresses at the interfaces are exceeded, these factors tend to lead to unstable void growth, debonding and delamination at package interfaces. Because of the porous nature of the materials used in manufacturing electronic packages, the packages will tend to collect moisture when left exposed, unsealed, in an uncontrolled environment. Moisture in the package may vaporize and develop pressure when the temperature within the package is elevated. This pressurized gas will push the molten, non-porous solder out from under the die, possibly creating shorts between circuits in the package as well as reducing the strength of the bond of the die to the substrate. Secondly, moisture within electronic packages causes interfacial adhesion degradation at the interfaces (solder mask to copper, solder mask to mold compound, etc). Therefore, the package moisture sensitivity performance will largely be determined by the adhesion strength of the interfaces at elevated temperatures. Once the interface delaminates, the moisture can penetrate under the die and later push out the solder if the solder melts in a subsequent operation such as PCB reflow processing.

Molten solder can also be pushed out of the package by vapor pressure build-up in the voids present in the solder itself. The pressure in the voids can be high and, when no escape path for the gas is present, the void will expand within the bulk of the solder itself. Moisture that has penetrated along a degraded interface into the interior area of the solder may vaporize when the temperature rises, also leading to solder spread. In general, these two events are not exclusive and occur together to cause solder flow in the package, which leads to failure.

FIGS. 1A & 1B illustrate a typical current design for a die attach pad 10 before a die 108 is soldered in place. FIG. 1A shows a top view of substrate 100 with a solder mask 102 applied to the surface of the substrate 100. FIG. 1B shows a cross-section view taken at the location and in the direction indicated by dotted line 99 in FIG. 1A. An opening 104 is created in the solder mask 102 to define the die attachment area, also referred to as a die attach pad, to be wetted by the solder, where the opening 104 is slightly typically larger than the die 108 that will be attached, the die profile 120 indicating where the die edges will be when the die is attached.

FIGS. 2A & 2B illustrate a typical current design for a die attach pad, after a die is soldered in place. FIG. 2A shows a top view and FIG. 2B shows a cross-section view, taken at section 99 of FIG. 2A, of the same opening 104 after die 108 has been attached with solder 106. It can be seen that the die 108 is floating on the solder 106 and is raised above the solder mask 102. A typical solder mask is approximately 30 micrometers (1.2 mils) thick while a typical solder stencil (not shown), used to apply solder paste to select locations, is approximately 125 micrometers (5 mils) thick, leaving a layer of solder paste (not shown) that is much thicker than the solder mask 102. Some of this solder paste may be flux that will be removed during solder reflow but the remaining solder 106 will remain as a thicker layer than the surrounding solder mask 102. Distance L1 is the distance from the center of the die to the nearest edge of the die, which is the distance that a void, or bubble, formed at the center of the solder pad would have to travel to reach a free edge of the solder where the bubble could vent to the atmosphere. As L1 become larger, a higher pressure is required in the void to push the solder out of the way over the distance L1. A void 110 is shown in FIG. 2B that was formed during the attach process and unable to escape from the bulk material of solder 106 while the solder 106 was molten.

FIGS. 3 & 4 are x-ray photographs, taken through the body of a die 108 attached using the current design of the die attach pad, showing voids in the solder 106. FIG. 3 shows a large void 110 covering approximately 25% of the area of solder 106 with numerous other smaller voids 110 also visible. Similarly, FIG. 4 shows numerous small-to-medium voids 110 in solder 106. These voids may have remained in the solder because there was insufficient time while the solder is molten for the gas to reach the atmosphere at the edge of the die or that there was insufficient pressure in the voids to displace the amount of solder between the voids and the atmosphere. These are usually considered failures per die attach process inspection standards.

FIG. 5 is a composite of two photographs showing solder spread after reflow during a subsequent printed circuit board (PCB) assembly process from a die attached using the current design of the die attach pad. Die 108 was bonded with solder 106 and underwent a 260 degree C. PCB mount reflow. Solder spread 120 is solder that has been pushed out from under die 108 and come into contact with devices 125 and 130.

FIG. 6 is an enlarged cross-section of a typical current die attach pad design. The void 110 is separated from the nearest atmosphere by distance D1. The pressure in void 110 during the die attach process was insufficient to displace the amount of solder 106 present in distance D1 and therefore the void 110 remained in the bulk of solder 106 until the end of the die attach process. Also shown are two typical failures that may be related to void 110. Crack 310 can be created when pressure is formed in void 110 by heating during subsequent reflow or rework operations. As the pressure in void 110 presses upwards and downwards on the top and bottom interior surfaces, respectively, of void 110, tensile stress is created in the solder 106 at the tip 305 of void 110. If the tensile stress exceeds the tensile strength of solder 106, a crack 310 can form starting at tip 305 and propagating through solder 106. Pressure in void 110 will also press to the right and left, in this view, against the solder 106 and create compressive stress in the bulk material of solder 106 and in the adjacent solder mask 102. This may produce a failure where the solder mask 102 delaminates from the substrate 100 starting at corner 315. The solder 106 penetrates along the interface between the solder mask 102 and the substrate 100, creating a flow path 320 that can reach other devices or circuits.

FIG. 7 is an enlarged cross-section of a typical current die attach pad design, showing tilt of the attached die. FIG. 7 illustrates how a typical solder die attach pad, such as shown in FIGS. 2A & 2B, may allow an angle 350 of as much as five degrees (not shown to scale) relative to the substrate as the die 108 is floating unconstrained on the top of a single mass of solder 106.

Hence, solder used to attach semiconductor dice accordingly to the current processes is subject to formation of internal voids during reflow processes during assembly due to, among other causes, the presence of moisture. Moisture can also penetrate the semiconductor package and, after weakening one of more interfaces between components and materials within the package, migrate into the solder joint area. Subsequent heating of the solder joint, such as during a PCB assembly process, can vaporize this moisture, leading to solder spread and delamination. There is a need to provide a mechanism or process to minimize the formation of voids during and after the die attach process.

SUMMARY

A semiconductor device is disclosed according to certain embodiments of the present disclosure. The semiconductor device comprises a die, a substrate having a die attachment area with a perimeter, and a solder layer located within the die attachment area and attached to both the substrate and the die. The solder layer has at least one vent channel connected to the perimeter of the die attachment area. The maximum distance from any point in the solder layer to the nearest free surface of the solder at a vent channel or at the perimeter of the die is less than the distance from the center of the die to the nearest edge of the die.

A die attachment pad is disclosed according to certain embodiments of the present disclosure. The die attachment pad includes a substrate having a die attachment area with a perimeter and a solder mask attached to the substrate surface having at least one opening located over a portion of the die attachment area. The maximum distance from any point in the solder mask openings to the nearest edge of the solder mask is less than a distance from the center of the die attachment area to the nearest edge of the perimeter of the die attachment area.

A method for attaching a die to a substrate is disclosed according to certain embodiments of the present disclosure. The method includes the steps of forming a layer of solder on a substrate in a die attachment area, placing a die on the solder layer, heating the substrate, die, and solder to a temperature sufficient to reflow the solder, and cooling the substrate, die, and solder to a temperature sufficient to solidify the solder. The solder layer is formed with at least one channel connected to the outside edge of the die attachment area, wherein a maximum distance from any point in the solder mask openings to the nearest edge of the solder mask is less than a distance from the center of the die attachment area to the nearest edge of the die attachment area.

BRIEF DESCRIPTION OF THE DRAWINGS

The following detailed description will be more readily understood in conjunction with the following drawings. The drawings disclose illustrative embodiments. They do not set forth all embodiments and other embodiments may be used in addition or instead. Details that may be apparent or unnecessary may be omitted to save space or for more effective illustration. Conversely, some embodiments may be practiced without all of the details that are disclosed. When the same numeral appears in different drawings, it is intended to refer to the same or like components or steps.

FIGS. 1A & 1B illustrate a typical current design for a die attach pad, before a die is soldered in place.

FIGS. 2A & 2B illustrate a typical current design for a die attach pad, after a die is soldered in place.

FIGS. 3 & 4 are x-ray photographs, taken through the body of a die attached using the current design of the die attach pad, showing voids in the solder.

FIGS. 10A and 10B show two alternate examples of the configuration of the openings in the solder mask according to certain embodiments of the present disclosure.

FIGS. 11 & 12 are x-ray photographs of die attached using a vented die attach pad design according to certain embodiments of the present disclosure.

DETAILED DESCRIPTION OF THE DRAWINGS

Figure 5:
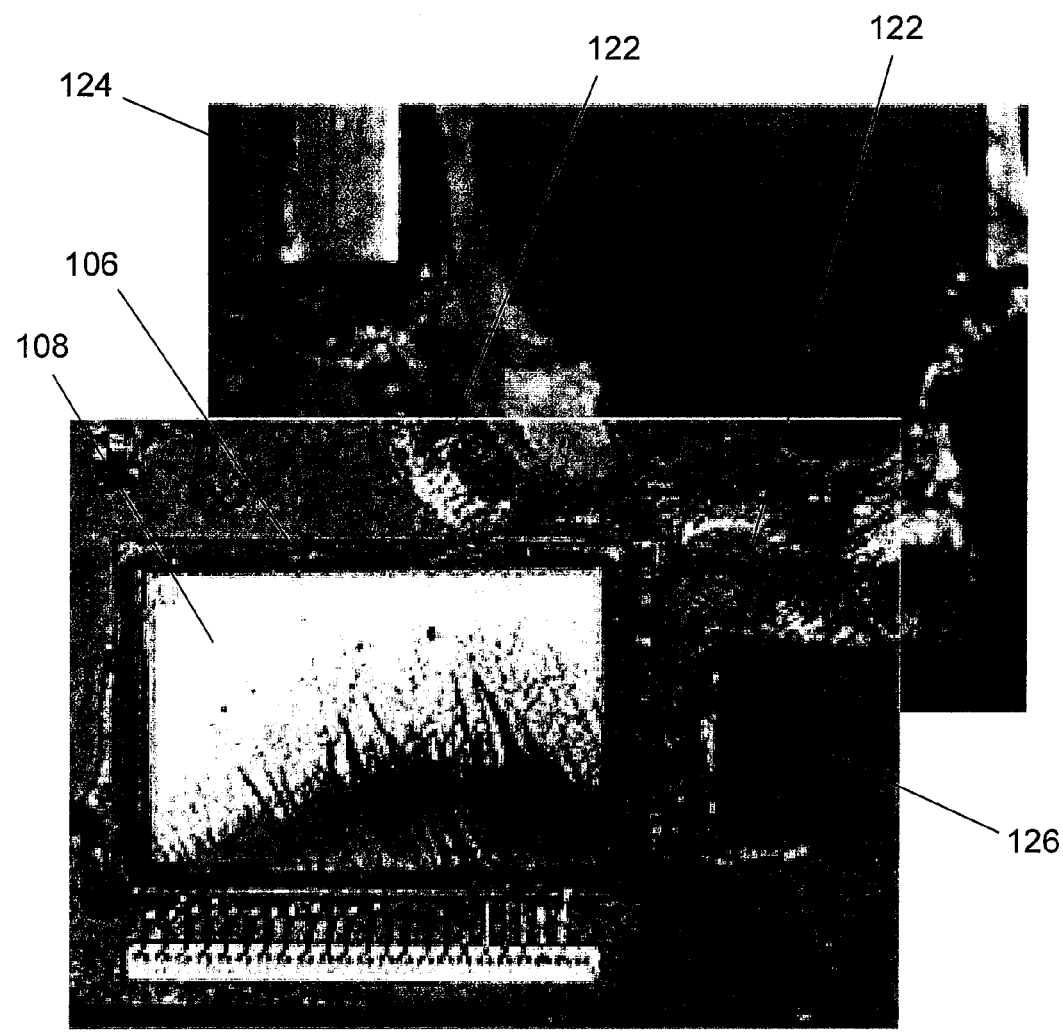
FIG. 5 is a composite of two photographs showing solder spread after reflow from a die attached using the current design of the die attach pad.

The present disclosure address the need, among others, to minimize the formation of voids during the die attach process and the spread of solder during subsequent operations in semiconductor packaging.

The use of solder to attach an IC die to a substrate provides, among other features, a good thermal conduction path from the die to the substrate. Voids, cracks, and delamination of the solder from either the die or the substrate degrade the conductivity of the path. In addition, pressure that develops in voids or in cracks in the interior of the solder can, when the solder melts during rework or reflow operations, force the molten solder out from under the die which can cause a number of different types of failure.

The die attach process using solder is typically performed by applying a solder controlling layer or coating to the substrate. For substrate materials that are suitable for soldering (i.e. are wettable by solder and to which solder will adhere), such as copper, one common method of limiting the solder to specific locations is by applying a solder mask, which is well known to those of ordinary skill in the art. Solder masks can be patterned to create openings over a wide range of size and shapes. Alternately, a nonmetallic substrate such as bismaleimide triazine (BT) may be used. As BT is not wettable by solder, a wettable surface must be created in the die attachment area, which is commonly done by applying a coating of copper to the BT. The copper may be overlaid with nickel and gold or coated with organic solder preservative (OSP). For a BT substrate, the solder may be sufficiently limited by the wettable surface during reflow and it may not be necessary to use a solder mask. Subsequent discussion herein that refers to solder mask should be considered to encompass alternate methods of selectively applying solder to specific locations or limiting the spread of molten solder. Coating or plating an area of a non-wettable substrate, such as BT, with a wettable material, such as copper, to define a die attachment area is considered to be equivalent to coating the surface of a substrate with a solder mask with an opening to define a die attachment area.

Solder may be applied in a variety of forms known to those of ordinary skill in the art. Solder may be provided in the form of a paste of powdered solder mixed with flux or other materials that improve the processing or final performance of the solder bond, or a powder, or preformed piece of solder that may also include flux and other materials as a mixture or coating. Subsequent discussion herein of the application of solder should be considered to include solder paste and all other techniques of providing solder and associated materials such as flux, including any cleaning processes required prior or subsequent to the soldering process.

Heating the solder to molten state is commonly done in an oven in a controlled atmosphere with a controlled temperature profile over time to heat the components up to a temperature in excess of the liquidus point of the solder and cooling them back down below the solidus point with causing damage to the components. This is commonly referred to as a "reflow" process. Other methods of melting solder, either locally for a single device or for an entire assembly, are known to those of ordinary skill in the art. Subsequent discussion herein referring to reflow should be considered to include all methods of heating a semiconductor assembly.

Figures 8A, 9A:
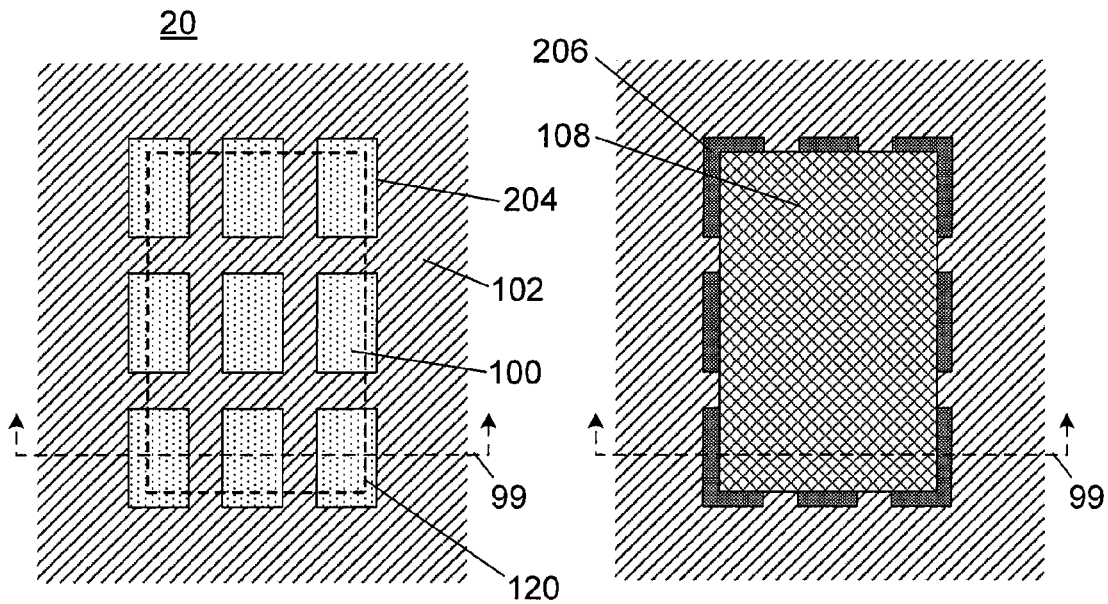
FIGS. 8A & 8B illustrate a vented die attach pad design, before a die is soldered in place, according to certain embodiments of the present disclosure.
FIGS. 9A & 9B illustrate a vented die attach pad design, after a die is soldered in place, according to certain embodiments of the present disclosure.
Figures 8B, 9B:
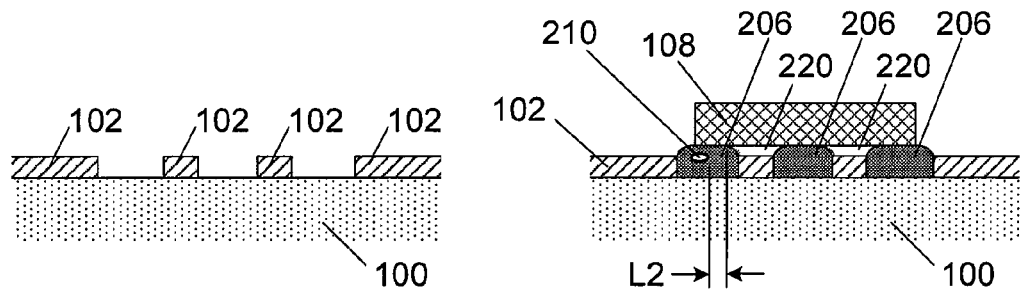

FIGS. 8A & 8B illustrate a top view and a cross-section of a vented die attach pad design 20, before the same die 108 is soldered in place, according to certain embodiments of the present disclosure. FIG. 8A shows a top view similar to FIG. 1A. FIG. 8B shows a cross-section view taken at section 99 of FIG. 8A. A patterned solder mask 102 has been applied to substrate 100, forming a "window pane" set of openings 204 in solder mask 102.

FIGS. 9A & 9B show top and cross-section views of a die 108 attached by multiple solder segments 206, each of which is formed in one of the openings 204. FIG. 9A shows the same view as in FIG. 2A. FIG. 9B shows a cross-section of FIG. 9A, wherein it can be seen that die 108 floats on the solder segments 206 above solder mask 202. This elevation of the die 108 above the solder mask 102 forms vent channels 220 between solder segments 206, each channel 220 open to the air surrounding the assembly. Distance L2 is the distance from the center of the solder segment 206 to the nearest free edge, which is shown as the edge of vent channel 220, which is the distance that a void, or bubble, formed at the center of the solder pad would have to travel to reach a free edge of the solder where the bubble could vent to the atmosphere. It can be seen, by comparison of L2 with the distance L1 of FIG. 2B, that the maximum distance that a void has to travel with a vented die attach pad is much smaller than the existing design. This limits the size of the void that is present after die attach, as larger voids are vented. A tiny void 210 is shown in FIG. 9B in the bulk material of one solder segment 206, where the size of void 210 is much smaller than that of void 110 in FIG. 2B.

Figure 9C:
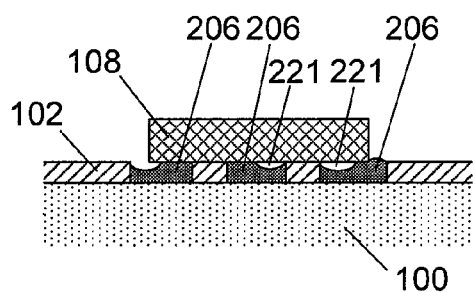
FIG. 9C illustrates an alternate vent path structure, according to certain embodiments of the present disclosure.

FIG. 9C illustrates an alternate vent path structure, according to certain embodiments of the present disclosure. In this embodiment, the volume of solder segment 206 is less than the volume of the volume enclosed by the area of the opening in solder mask 102 multiplied by the thickness of solder mask 102. As can be seen, the die 108 is resting on the surface of the solder mask 102. The solder 206 is in contact with a portion of the underside of die 108 over each opening in solder mask 102, leaving an open area that functions as vent path 221. As long as each vent path 221 reaches an edge of the die 108 then the gas will vent in the same manner as for the configuration of FIG. 9B. The pattern of openings shown in FIG. 15 may be suitable for this embodiment.

After die 108 is bonded to the substrate 100, the entire assembly may be overcoated with a layer of molding compound (not shown). This compound provides mechanical and moisture protection for the assembly. The compound is typically too thick to fill the vent channels 220, leaving these channels 220 open during subsequent operations that may melt the solder 206. If the remaining voids 210 expand at a later time, during a PCB reflow operation for example, then these open channels 220 provide safe spaces into which the solder 206 may spread without a risk of contacting other components on the substrate and causing a failure. This ability to absorb a limited amount of solder expansion without failure provides an increased factor of safety related to temperatures of operations subsequent to the die attach process.

FIGS. 10A and 10B show two alternate examples of the configuration of the openings in the solder mask 102 according to certain embodiments of the present disclosure. FIG. 10A shows a window pane set of openings 204B where the outer edges of the outside openings are aligned with the edges of the die outline 120. FIG. 10B shows a window pane set of openings 204C where the outer edges of the outside openings are inside the edges of the die outline 120, such that the die (not shown) will overhang the solder when the die is attached. Other variations of the relative size and placement of the openings in solder mask 102 relative to the die outline 120 are possible, including non-rectangular openings as well as asymmetric and staggered patterns of openings, without departing from the scope of the invention disclosed herein.

FIGS. 11 & 12 are x-ray photographs of die attached using a vented die attach pad design according to certain embodiments of the present disclosure. FIG. 11 shows a 9-segment configuration of solder segments 206, wherein there are only a few small voids 210 visible in the photograph. The large light circle overlapping the right middle solder segment 206 is an artifact of the shadowed rectangular element and not a void in the solder. FIG. 12 shows a 6-segment configuration of solder segments 206, wherein there are only a few small voids 210 visible in the photograph.

Figure 6:
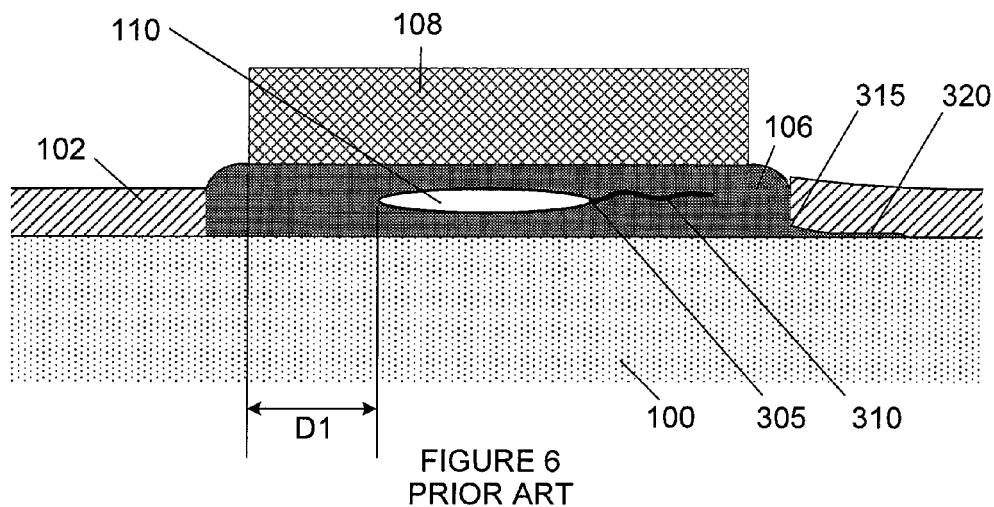
FIG. 6 is an enlarged cross-section of a typical current die attach pad design, showing voids and various failure mechanisms.
Figure 13:
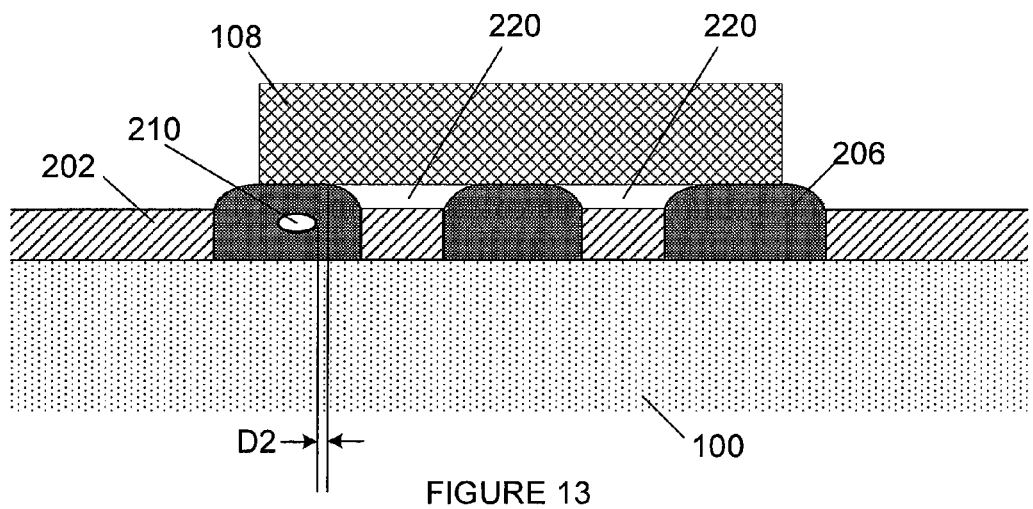
FIG. 13 is an enlarged cross-section of a vented die attach pad design, according to certain embodiments of the present disclosure.

FIG. 13 is an enlarged cross-section of a vented die attach pad according to certain embodiments of the present disclosure. This embodiment is a 9-segment configuration as previously shown in FIG. 9B. Die 108 is bonded to solder segments 206 and raised above solder mask 102, forming vent channels 220. A void 210 is shown in one of the solder segments 206. The shortest distance from void 210 to atmosphere, in this embodiment, is distance D2 from the right edge of void 210 to the left edge of the leftmost channel 220. It can be seen by comparison with FIG. 6 that D2 is much smaller than D1. The maximum value that D2 can assume is equal to L2 of FIG. 9B, which is the distance from the center of the solder pad 206 to the nearest free edge, which is shown as the edge of vent channel 220. With a smaller amount of solder to be displaced, voids larger than void 210 will expand over distance D2 and contact a free surface of solder segment 206, the trapped gas will escape to the atmosphere, and the larger void will collapse. The largest possible distance D2, in this embodiment, is half the width of a solder segment 206 whereas the distance D1 can be as large as half the width if die 108. As D2 is a small fraction, approximately 10% in this example, of D1, voids the size of void 110 cannot form in a vented die attach pad of this configuration as the void surface will contact a free surface of the solder and escape.

If a void 210 does form in a solder segment 206, the smaller size of void 210, and the consequent smaller amount of gas or moisture that can be contained in this void 210 compared to the size of a void 110 in a typical current die attach pad, limits the force or displacement that can be applied to the solder 206. This minimizes the spread of solder beyond the die and the bridging or other damage seen with solder spread in typical current die attach pads. The reduced stress in the solder minimizes the potential for cracking and delamination.

Figure 7:
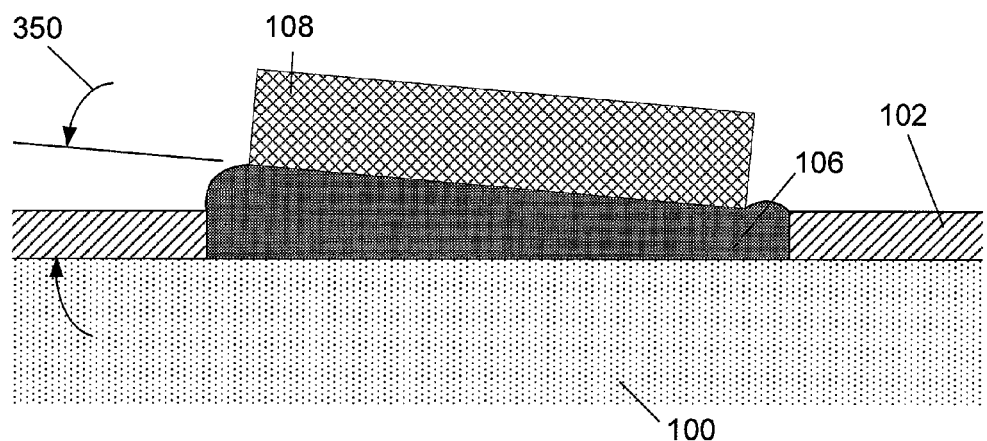
FIG. 7 is an enlarged cross-section of a typical current die attach pad design, showing tilt of the attached die.
Figure 14:
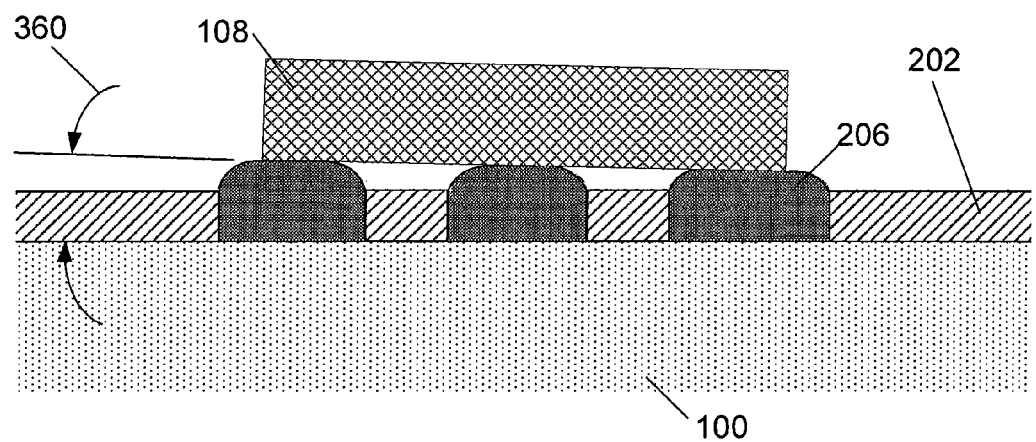
FIG. 14 is an enlarged cross-section of a vented die attach pad design showing a reduced level of die tilt, according to certain embodiments of the present disclosure.

FIG. 14 is an enlarged cross-section of a vented die attach pad design showing a reduced level of 'die tilt', according to certain embodiments of the present disclosure. Multiple solder pads, such as illustrated in FIGS. 9A and 9B, provide an additional benefit of reduced die tilt, as measured by angle 360, for the attached die compared to the die tilt 350 of FIG. 7.

FIG. 14 illustrates a die 108 floating on multiple masses of solder 206 of substantially equal height. The small solder masses 206 act like the legs of a table and provide more balanced support across the die 108, compared to the configuration shown in FIG. 7, resulting in a maximum angle 360 of less than 1.5 degrees (not shown to scale) relative to the substrate. This reduced die tilt results in improved accuracy of subsequent wire bonding operations and higher throughput.

Figure 15:
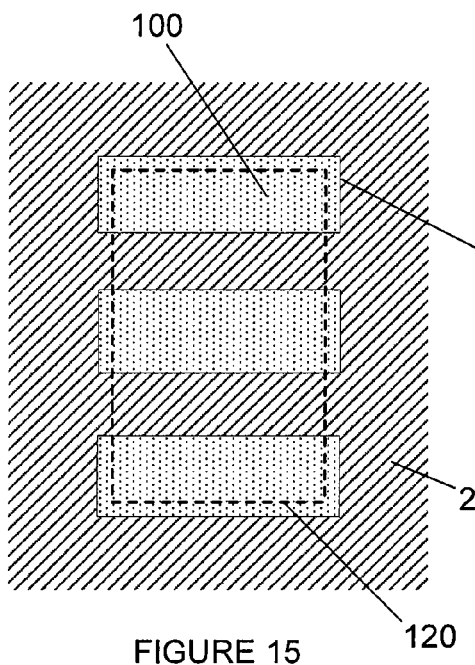
FIGS. 15-18 illustrate alternate embodiments of a vented die attach pad according to certain embodiments of the present disclosure.
Figure 16:
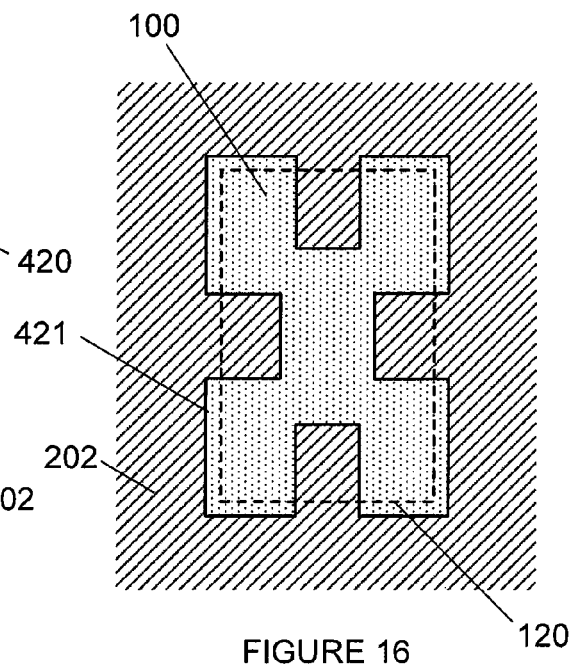
Figure 17:
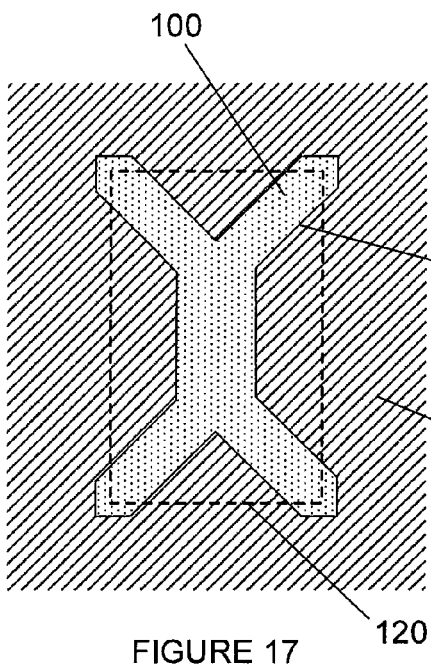
Figure 18:
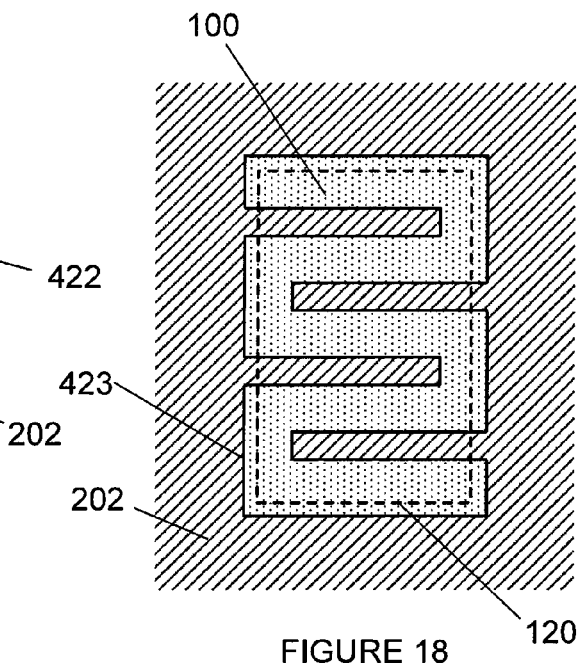

FIGS. 15-18 illustrate alternate embodiments of a vented die attach pad according to certain embodiments of the present disclosure. Each of FIGS. 15-18 illustrate a solder pad configuration in the same manner as the top view of FIG. 8A, wherein substrate 100 is revealed in the openings 420, 421, 422, and 423 in solder mask 102. The die attachment area where die 108 will overlay the openings 420-423 is shown as outline 120. Vent channels will form over areas where solder mask 102 includes "legs" or peninsulas that protrude into the opening of the solder mask 102 and underlie outline 120. FIG. 15 discloses a configuration wherein openings 420 create vent channels running across the width of the die outline 120. FIG. 16 discloses a configuration where a roughly X-shaped opening 421 creates vent channels that penetrate under the die from each edge but do not connect to other vent channels or atmosphere on the opposite side of the die. FIG. 17 discloses a configuration where opening 422 has a different X-shape that creates larger vent channels than those of FIG. 15 and include angled edges. FIG. 18 discloses a serpentine opening 423 that creates a series of channels penetrating under the die from alternating sides, leaving a continuous strip of solder under the die. In all these configurations, a feature that is critical to minimizing the formation of voids, and the consequent risk of cracks and delamination, is the maximum lateral distance, with reference to an "up/down" axis that is perpendicular to the plane of the substrate and die, from any point in the solder to the atmosphere. Variations of these designs and processes that provide a minimal distance from the center of the solder to atmosphere may be possible and do not depart from the scope of the invention disclosed herein.

The foregoing disclosure provides a vented die attach pad that reduces the size of voids in the die attach solder. The use of several small solder pad openings in the solder mask instead of a large single pad opening in the die attachment area reduces the amount of solder paste applied both in total and in each individual opening. This reduction in the amount of solder paste reduces the amount of flux present, thereby reducing the amount of gas that will be created in the solder during reflow. The layout of the individual openings of the vented die attach pad provides vent channels that are defined, in the examples disclosed, by the solder mask that is applied to the substrate. These openings through the solder under the die provide a vent path for moisture and gasses created during the solder reflow process of die attach. These channels also provide a safe expansion space during subsequent temperature excursions, such as might occur in a reflow oven during a PCB attachment operation, allowing the solder to spread without the solder extending beyond the perimeter of the die and shorting to an adjacent component or circuit. A die attach pad with multiple segments of solder may also offer a reduction in die tilt, compared to the current single-opening die attach pad, by providing independent and equal support by the solder at the opposite edges of the die. The reduction in solder voids, provision of a safe expansion space for solder spread, and reduced die tilt all contribute to improved yield on a semiconductor packaging production line and reduced failures in production and in the field.

The previous description is provided to enable any person skilled in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A semiconductor device, comprising:
   a die;
   a substrate having a die attachment area with a perimeter; and
   a layer of solder located within the die attachment area and attached to both the substrate and the die, the solder layer having at least one vent channel connected to the perimeter of the die attachment area, wherein a maximum distance from any point in the solder layer to a nearest free surface of the solder at a vent channel or at the edge of the die is less than a distance from a center of the die to the nearest edge of the die.

2. The semiconductor device of claim 1 further comprising a solder mask attached to the substrate surface, the solder mask having one or more openings located over a portion of the die attachment area, wherein the solder layer is contained within the solder mask openings.

3. The semiconductor device of claim 2 wherein the solder layer is thicker than the solder mask and the vent channels are formed over the solder mask where it covers the die attachment area.

4. The semiconductor device of claim 3 wherein the heights of the solder within each opening are substantially the same and the die tilt is less than 1.5 degrees.

5. The semiconductor device of claim 2 wherein the solder mask has at least four openings.

6. The semiconductor device of claim 5 wherein the solder mask has at least nine openings.

7. The semiconductor device of claim 2 wherein the substrate comprises a metal.

8. The semiconductor device of claim 1 wherein the substrate comprises a material that is not wetted by solder, the semiconductor device further comprising a coating or plating of a material that is wetted by solder applied to the substrate over one or more areas covering at least a portion of the die attachment area, wherein the solder layer is contained within the coated or plated areas.

9. A die attachment pad, comprising:
   a substrate having a die attachment area with a perimeter; and
   a solder mask attached to the substrate surface having one or more openings located over a portion of the die attachment area, wherein a maximum distance from any point in the solder mask openings to a nearest edge of the solder mask is less than a distance from the center of the die attachment area to the nearest edge of the perimeter of the die attachment area.

10. The die attachment pad of claim 9 wherein the total area of the openings of the solder mask is less than that of the die attachment area.

11. The die attachment pad of claim 9 wherein the solder mask has at least four openings.

12. The die attachment pad of claim 9 wherein the substrate comprises a material that is not wetted by solder, the areas to be covered by the solder mask are left bare and the openings of the solder mask are defined by a coating or plating of a material that is wetted by solder applied to the substrate over the areas of the openings.

13. The die attachment pad of claim 9 further comprising a layer of solder, wherein the solder layer is attached to the substrate over at least a portion of the openings of the solder mask.

14. The die attachment pad of claim 13 wherein the solder layer is thicker than the solder mask.

15. The vented die attach pad of claim 13 wherein the solder layer comprises one or more pieces of preformed solder.

16. A method for attaching a die to a substrate, the method comprising:
   forming a solder mask on a substrate with one or more openings over a portion of a die attachment area of the substrate, wherein a maximum distance from any point in the solder mask openings to a nearest edge of the solder mask is less than a distance from the center of the die attachment area to the nearest edge of the die attachment area;
   placing a quantity of solder on the substrate within each opening in the solder mask;
   placing a die on the solder;
   heating the substrate, the die, and the solder to a temperature sufficient to reflow the solder; and
   cooling the substrate, die, and solder to a temperature sufficient to solidify the solder.

17. The method of claim 16 wherein the thickness of the solder layer is greater than the thickness of the solder mask.

18. The method of claim 16 further comprising applying a molding compound over the exposed surfaces of the die, the solder, and the substrate.

19. The method of claim 16 wherein the substrate comprises a material that is not wetted by solder, and forming a solder mask comprises coating or plating the substrate over a portion of the die attachment area with a material that is wetted by solder.

20. The method of claim 16 wherein the solder is applied as a preformed piece of solder.

* * * * *